United States Patent

Tamarkin et al.

[11] Patent Number: 6,049,467
[45] Date of Patent: Apr. 11, 2000

[54] STACKABLE HIGH DENSITY RAM MODULES

[75] Inventors: Vladimir K. Tamarkin, Huntingdon Valley; Grant M. Smith, Bryn Athyn, both of Pa.

[73] Assignee: Unisys Corporation, Blue Bell, Pa.

[21] Appl. No.: 09/144,322

[22] Filed: Aug. 31, 1998

[51] Int. Cl.$^7$ .................................................. H05K 7/02
[52] U.S. Cl. .................. 361/790; 361/783; 361/820; 361/772; 361/775; 257/686; 257/723; 257/712; 257/713; 174/52.4
[58] Field of Search .................................. 361/790, 783, 361/820, 772, 775, 684, 773, 760, 689; 257/686, 723, 712, 713, 678, 777; 174/52.4

[56] References Cited

U.S. PATENT DOCUMENTS

| | | |
|---|---|---|
| 4,884,237 | 11/1989 | Mueller et al. . |
| 5,150,279 | 9/1992 | Collins et al. . |
| 5,164,916 | 11/1992 | Wu et al. . |
| 5,191,404 | 3/1993 | Wu et al. . |
| 5,397,747 | 3/1995 | Angiulli et al. ........................ 438/109 |
| 5,426,563 | 6/1995 | Moresco et al. ........................ 361/689 |
| 5,473,196 | 12/1995 | De Givry . |
| 5,490,041 | 2/1996 | Furukawa et al. . |
| 5,572,068 | 11/1996 | Chun . |
| 5,586,009 | 12/1996 | Burns . |
| 5,612,570 | 3/1997 | Eide et al. . |
| 5,613,033 | 3/1997 | Swamy et al. . |
| 5,615,089 | 3/1997 | Yoneda et al. . |
| 5,645,434 | 7/1997 | Leung . |
| 5,652,462 | 7/1997 | Matsunaga et al. . |
| 5,661,339 | 8/1997 | Clayton ................................... 257/678 |
| 5,701,233 | 12/1997 | Carson et al. . |
| 5,703,400 | 12/1997 | Wojnarowski et al. . |
| 5,708,298 | 1/1998 | Masayuki et al. . |
| 5,754,408 | 5/1998 | Derouiche .............................. 361/773 |
| 5,781,415 | 7/1998 | Itoh ........................................ 361/790 |
| 5,841,686 | 11/1998 | Chu et al. ............................... 365/51 |
| 5,859,792 | 1/1999 | Rondeau, II et al. .................... 356/52 |

Primary Examiner—Leo P. Picard
Assistant Examiner—David Foster
Attorney, Agent, or Firm—Steven B. Samuels; Mark T. Starr; Ratner & Prestia

[57] ABSTRACT

A stacked circuit assembly is provided for mounting memory modules in close proximity to an integrated circuit. The assembly includes an integrated circuit mounted on a printed circuit board and at least one stacked printed circuit board mounted in substantially parallel arrangement with respect to the printed circuit board on which the integrated circuit is mounted. A memory module is mounted for electrical connection on a surface of the stacked printed circuit board and an interface connector is mounted on facing surfaces of the printed circuit board and the stacked printed circuit board, thereby providing means for both mechanical and electrical connection between the boards. The integrated circuit and the memory module are mounted in parallel relationship with respect to one another for electrical interconnection through the boards and the interface connectors, thereby reducing the physical distance between the integrated circuit and the memory module.

18 Claims, 4 Drawing Sheets

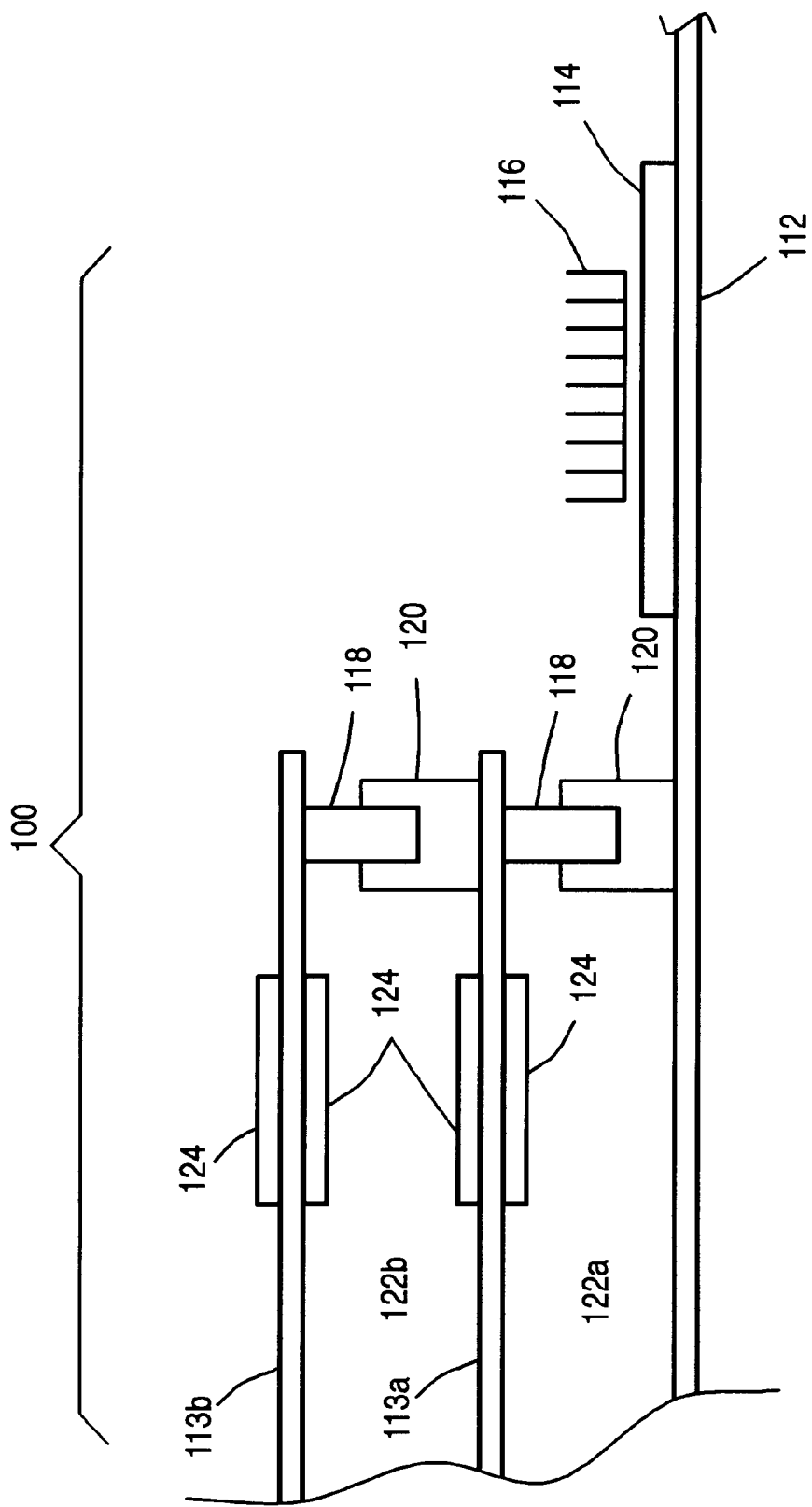

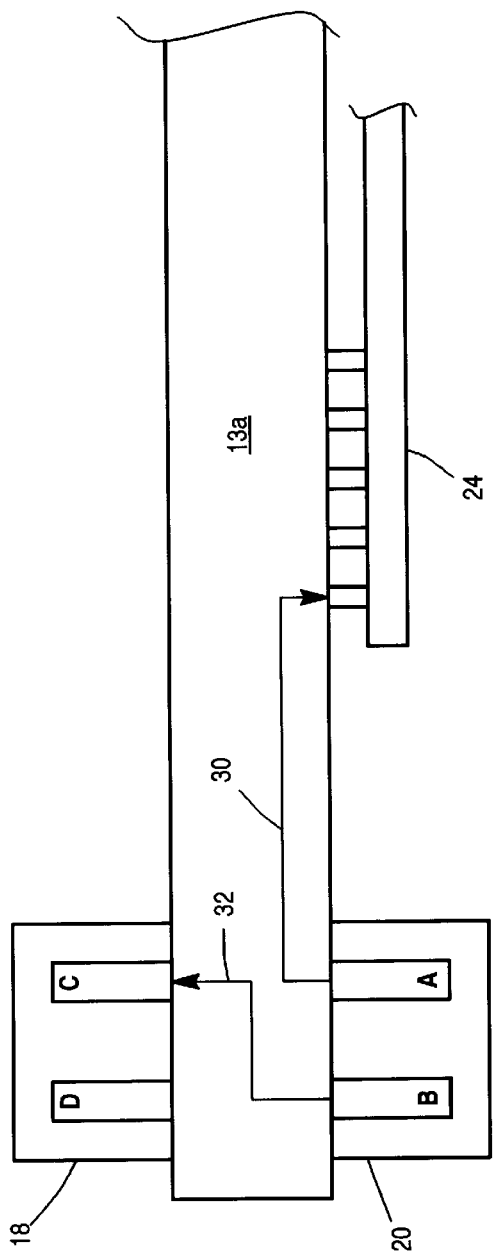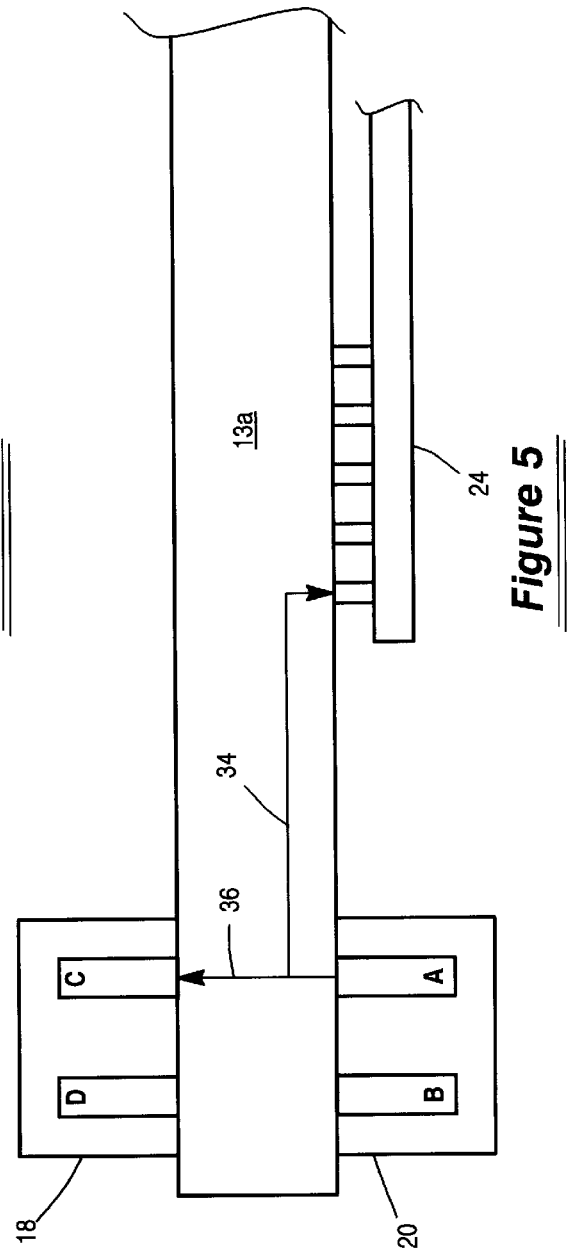

STACKABLE HIGH DENSITY RAM MODULES

FIELD OF THE INVENTION

The present invention relates generally to an improved circuit assembly and, more particularly, to a circuit assembly having memory modules mounted in a stacked configuration.

BACKGROUND OF THE INVENTION

There has been an ever-increasing need for greater memory capacity and rapid data processing. There have been many significant advances with respect to the design of faster and more complex processors, application specific integrated circuits (ASICs), and the like. Such complex circuits sometimes take advantage of the use of multiple parallel processors and ancillary circuitry.

Often, attempts are made in circuit design and structure to limit the signal travel distance between processors, memories, and other ancillary components so that processor-operating speed is not unduly limited and rapid data processing and management can therefore be achieved. In fact, processor-operating speeds are sometimes reduced because of unavoidable signal travel distance requirements that can be imposed by the specific system's design. This is particularly true for the use of multiple high-speed processors with one or more essential ASICs.

Accordingly, as the clock frequency of electronics increases, the physical distant between components on a data path becomes more and more critical. This physical distance is particularly important between an integrated circuit such as an ASIC and a memory module such as a cache that is connected to the integrated circuit. The physical distance between such components will impact the access time and, therefore, the performance of the resulting circuit assembly.

One method of reducing the physical distance between an integrated circuit and its memory module is to stack the memory module with respect to the integrated circuit. Such stacking of the memory modules can also permit the manufacturer to partition the total memory module assembly into smaller, less expensive portions in order to provide improved configurability and upgrading.

Various attempts have been made in the past to utilize a stacked structure. U.S. Pat. No. 5,191,404 to Wu et al. describes a low-profile, high-density package for integrated circuit chips. First and second multilayer interconnect members, each having low-profile memory chips mounted thereon, are affixed to one another and low-profile edge clips are subsequently applied to connect the conductive portions of the interconnect members.

U.S. Pat. No. 5,613,033 to Swamy et al. describes an interconnect system in which one or more laminated modules embodying electrical devices can be stacked in a three dimensional configuration upon a printed circuit board. The laminated module includes an intermediate component with vias extending through it, a female component having vias extending through it, and a male component also having vias extending through it. The components include a solder coating that allows permanent fixture of the various components with respect to one another.

U.S. Pat. No. 5,701,233 to Carson et al. describes a stacked, multimodular circuit assembly including stacked, resealable, electronic circuit modules having embedded through-vias between their upper and lower surfaces. The stacked modules are electrically interconnected by interposing between adjacent modules a resealable, multi-channel connector array having electrically conductive channels coupled opposing through-vias in the adjacent modules.

Despite various prior attempts to stack circuit assemblies, there remains a need for improved circuit assemblies that can employ standard and commonly available components as well as known manufacturing techniques. Accordingly, it is an object of this invention to provide an improved stacked circuit assembly that is adapted for mounting memory modules such as RAM modules in close proximity to an integrated circuit such as an ASIC.

SUMMARY OF THE INVENTION

This invention achieves the aforementioned objectives by providing an assembly that is uniquely adapted for mounting standard memory modules in close physical proximity to an integrated circuit to which they are dedicated. The assembly includes an ASIC that is mounted on a mounting surface of a main printed circuit board. At least one stacked printed circuit board is provided and oriented in substantially parallel arrangement with respect to the main board on which the ASIC is mounted. The stacked board has a surface that faces toward the main board such that the facing surfaces of the boards together find a space therebetween. A memory module such as a RAM chip is mounted for electrical connection on a surface of the stacked board. One or more interface connectors are mounted for electrical connection between the boards such that the interface connector on the main board mates with the interface connector on the stacked board.

In this manner, both mechanical and electrical connection are provided between the boards. The interface connectors together therefore extend across the space defined between the boards. In such an assembly, the ASIC and one or more memory modules can be mounted in stacked and substantially parallel relationship with respect to one another, one above the other. Electrical interconnection as well as mechanical interconnection are provided through the boards and the interface connectors, thereby reducing the physical distance between the ASIC and the memory module or modules.

The ASIC can be mounted on a surface of the main board that either faces away from the stacked board or faces toward the stacked board. In the latter situation, the ASIC can occupy the space that is defined between the printed circuit boards.

Two or more stacked printed circuit boards can be utilized wherein a memory module is mounted on each of the stacked boards and the interface connectors are mounted on facing surfaces of the stacked boards. The interface connectors therefore provide the necessary mechanical and electrical connection between each of the stacked boards in order to form a structural assembly.

Plural interface connectors can be mounted on surfaces of each of the printed circuit boards. Also, they can be provided at the edge portion of the stacked printed circuit boards. In one preferred embodiment, the interface connectors on the printed circuit board are positioned on opposite sides of the ASIC. Accordingly, the ASIC and the interface connectors can be mounted on the same or opposite surface of the main board.

According to an exemplary embodiment of the invention, the stacked printed circuit board or boards also include internal connection paths for communicating signals between the interface connectors and various memory modules. At least one of the internal connection paths can be oriented to share signals between a memory module on each of the stacked printed circuit boards. Also, at least one of the internal connection paths can be oriented to dedicate a signal to a particular memory module on one of the stacked printed circuit boards and to prevent the sharing of such a dedicated signal with a memory module on another one of the stacked printed circuit boards.

BRIEF DESCRIPTION OF THE DRAWINGS

FIG. 3 is a side view of a portion of another embodiment of a circuit assembly according to this invention.

FIG. 4 is a schematic cross-sectional side view of an embodiment of a stacked printed circuit board assembly according to this invention.

FIG. 5 is a schematic cross-sectional side view of another embodiment of a stacked printed circuit board assembly according to this invention.

DETAILED DESCRIPTION OF THE INVENTION

Figure 1:
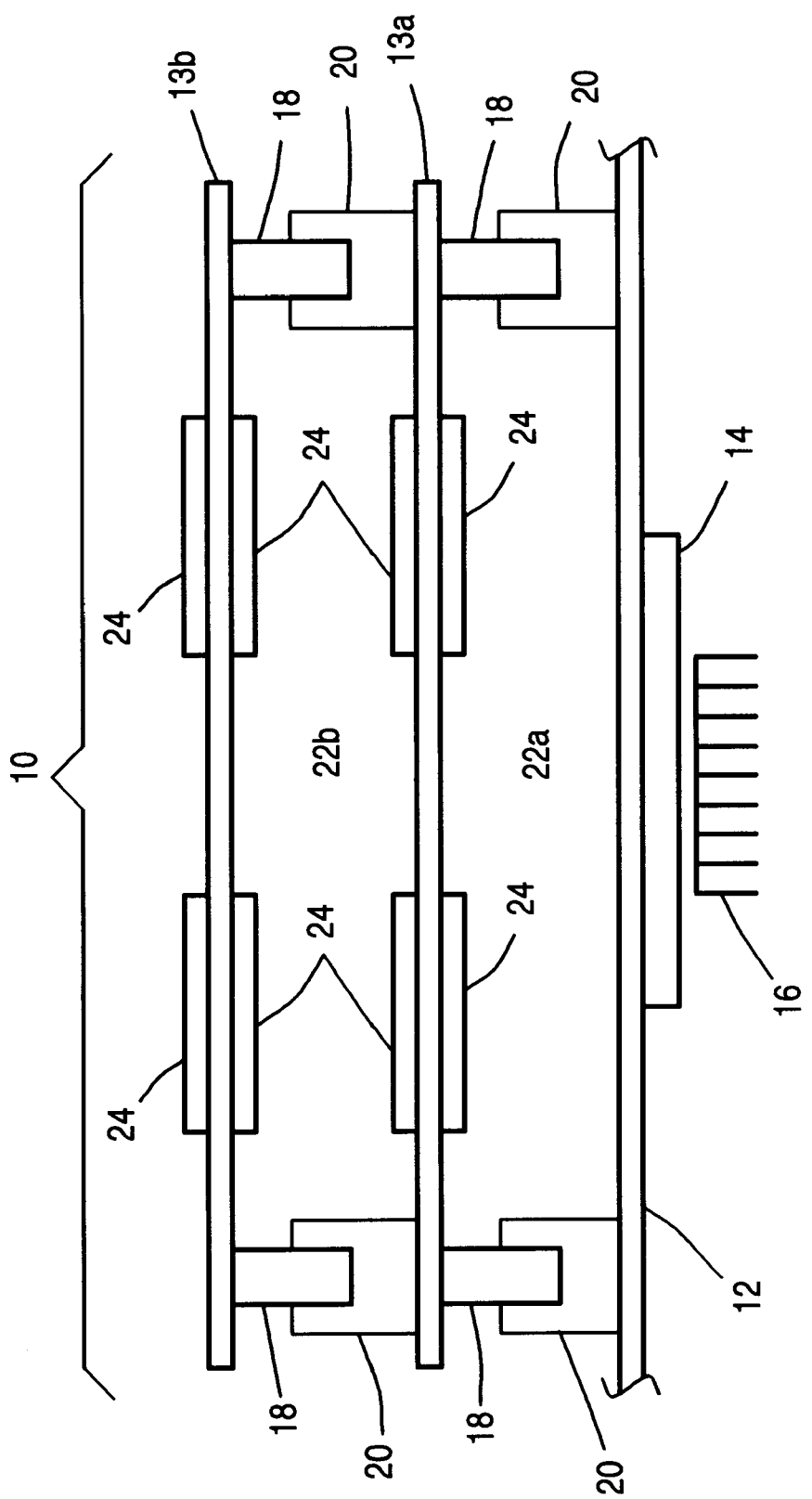
FIG. 1 is a side view of an embodiment of a circuit assembly according to this invention.

Preferred aspects of this invention will now be described with reference to specific embodiments selected for illustration in the drawings. It will be understood that this invention is not limited in its spirit or scope to the embodiments selected for illustration and description herein. Instead, the invention is defined separately in the appended claims. Also, it will be appreciated that the various figures are not intended to be to proportion or to scale.

In a preferred embodiment, a stackable memory module assembly according to this invention is a double-sided printed circuit assembly with memory devices on each side of the board to provide for maximum packaging efficiency and stub length reduction for bussed signals. There is preferably a male/female connector pair to provide connectivity from a motherboard or main board to a memory module, and from a first memory module to another memory module in a stack. The male connector therefore is on one side surface and the female is on the other side surface of the stacked board.

Having established a physical connection between the boards by a connector pair, it is also important to establish a practical logical connection to assure ASIC access to individual memory devices in the stackable format. In order to accomplish this, all signals between an ASIC and a memory module are preferably divided into two classes. The first class includes signals that are dedicated to an individual memory module such as address bits, chip select, clocks, and other signals. The other class includes signals that are shared or bussed between stacked memory modules such as data bits, WE/OE, and other shared signals. A preferred manner in which such signals are routed between connectors will be described later in detail. Accordingly, this invention defines a stackable format for high performance memory assemblies and a connection pattern to support such stacking.

Although this invention will be described with reference to the connection between an application specific integrated circuit (ASIC) and a random access memory (RAM) module, it is contemplated that the stackable circuit assembly described herein can be utilized with a wide variety of circuit components and in a wide variety of applications. The ASIC can therefore be interchanged with any integrated circuit or other circuit component and the RAM module can be replaced with any cache memory or other component; especially, wherein benefit is gained by reducing the physical distance between such components whether for performance, packaging, structural or other considerations.

Referring now to the figures, FIG. 1 provides a side view of a preferred embodiment of a stacked circuit assembly according to this invention, generally designated by the numeral "10". The assembly 10 includes a main printed circuit board 12 such as a motherboard. Printed circuit board 12 can be a multi-layered copper clad board that is formed from a multi-layered substrate with copper coatings on the facing surfaces of the substrate. Other conventional printed circuit board substrates can be substituted. Mounted on printed circuit board 12 for electrical connection is an application-specific integrated circuit (ASIC) 14. ASIC 14 is in the form of a conventional chip having a plurality of leads for electrical connection to the printed circuit board 12. In this embodiment, ASIC 14 is mounted to a lower or bottom surface of printed circuit board 12. Mounted adjacent to, and below, ASIC 14 is a conventional heat sink 16. Heat sink 16 is connected adjacent to ASIC 14 in order to provide a means for dissipating heat that is generated SIC 14 during operation.

Electrically and mechanically mounted above printed circuit board 12 are two stacked printed circuit boards 13a and 13b. As shown in this embodiment, boards 12, 13a, and 13b are stacked and mounted in substantially parallel arrangement with respect to one another, one above the other, in order to provide mounting surfaces for components in a three-dimensional configuration. A series of male connectors 18 and female connectors 20 provide electrical and mechanical interconnection between adjacent ones of the printed circuit board 12 and stacked printed circuit boards 13a and 13b. More specifically, a pair of spaced-apart male connectors are electrically connected to a top or upper surface of printed circuit board 12. Those male connectors 18 on printed circuit board 12 are connected to stacked printed circuit board 13a by means of a pair of spaced-apart female connectors 20 that are mounted for electrical connection to a bottom surface of stacked printed circuit board 13a. Similarly, a pair of spaced-apart male connectors 18 are mounted to an upper surface of stacked printed circuit board 13a for providing a means of mechanical and electrical connection to a pair of spaced-apart female connectors 20 that are mounted to a lower or bottom surface of stacked printed circuit board 13b.

Spaces 22a and 22b are defined between the surfaces of adjacent boards 12, 13a and 13b. Specifically, a space 22a is defined between the facing surface of printed circuit board 12 (its top surface) and the facing surface of stacked printed circuit board 13a (its bottom surface). Similarly, a second space 22b is defined between the facing surface of stacked printed circuit board 13a (its top surface) and the facing surface of stacked printed circuit board 13b (its bottom surface). Accordingly, pairs of male and female connectors 18 and 20 bridge the gaps or spaces that are defined between the facing surfaces of adjacent boards 12, 13a and 13b.

Shown in FIG. 1, a series of memory modules 24 such as RAM modules are mounted on the surfaces of stacked printed circuit boards 13a and 13b. In this embodiment, the memory modules 24 are mounted on both sides of each of the stacked printed circuit boards, although mounting on a single side of the boards is also contemplated. It should be noted that the number of stacked printed circuit boards such as board 13a and 13b can be increased from the two shown in FIG. 1 to "N" boards 13a–13n, depending on the quantity of memory modules necessary for connection or dedication to ASIC 14 as well as the structural configuration of the circuit assembly. Also, only one stacked printed circuit board need be used according to this invention.

While stacked printed circuit boards 13a and 13b are both mounted on the same side of printed circuit board 12 as shown in FIG. 1, it is of course contemplated that stacked printed circuit boards can be mounted on both sides of the printed circuit board 12. Also, stacked printed circuit boards can be mounted on the same side of printed circuit board 12 as the ASIC 14 is mounted although mounting on the opposite side is illustrated in FIG. 1, and such a configuration accommodates the positioning of heat sink 16.

Referring now to the perspective view illustrated in FIG. 2, details of stacked printed circuit board 13a will now be described. Extending upwardly from a facing surface 28 of stacked printed circuit board 13a is a pair of spaced-apart male connectors 18. In this embodiment, connectors 18 are elongated connectors having many internal contacts for connection to adjacent boards and their respective connectors. Extending downwardly from a lower or bottom surface of stacked printed circuit board 13a is a pair of spaced-apart, elongated, female connectors 20. Male and female connectors 18 and 20 are positioned on opposite sides of stacked printed board 13a in corresponding positions for reasons that will be described later with reference to FIGS. 4 and 5.

Connectors 18 and 20 are oriented along a perimeter portion of stacked printed circuit board 13a adjacent to a perimeter edge 26 of the board. In the space between each pair of connectors is a series of RAM memory modules 24. In this particular embodiment, two rows of four RAM modules are provided with each row of the modules being positioned closely adjacent to a male connector 18. Although now shown in this figure an equal or different number of RAM modules 24 can be mounted on the bottom surface of stacked printed circuit board 13a closely adjacent to female connectors 20.

Figure 2:
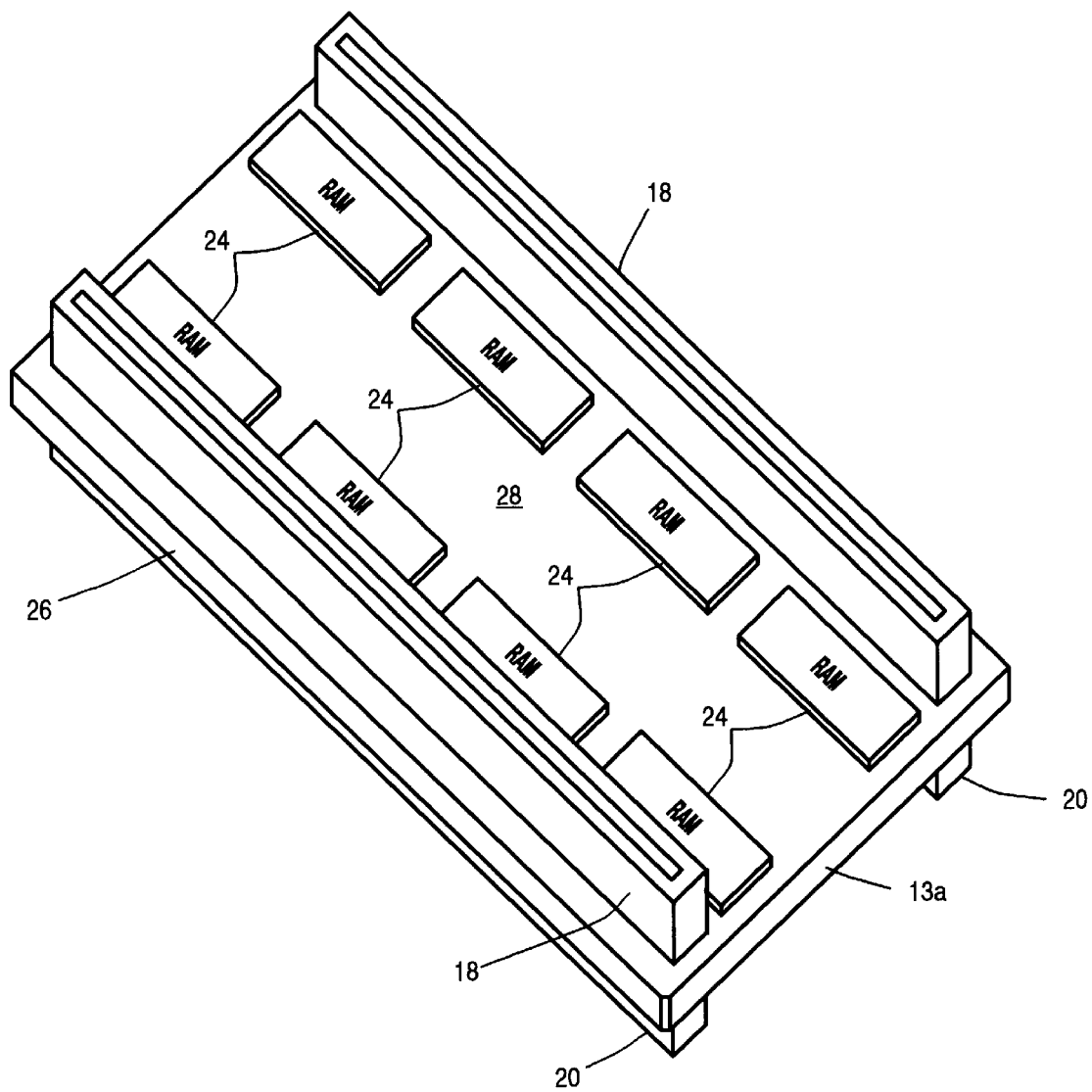
FIG. 2 is a perspective view of an embodiment of a stacked printed circuit board that can be utilized in the circuit assembly shown in FIG. 1.

It will now be understood in view of the embodiments selected for illustration in FIGS. 1 and 2 that the physical distances between the ASIC 14 and the various RAM modules 24 are reduced and minimized because of the stacked orientation of the various components with respect to one another. Also, the manner in which the stacked printed circuit boards 13a and 13b are mounted by means of connectors 18 and 20 with respect to printed circuit board 12 and ASIC 14 lends itself to the compact packaging of numerous RAM modules on any selected number of stacked printed circuit boards, while maintaining a reduced physical distance between an integrated circuit such as ASIC 14 and a dedicated cache or memory such as RAM memory modules 24.

Referring now to FIG. 3, another embodiment of a stacked circuit assembly accordingly to this invention is generally designated by the number "100". This assembly 100 differs from assembly 10 in that the ASIC is mounted on the same side of the motherboard as the various memory modules. There are various reasons (mechanical, structural or electrical) for such a configuration and the mounting of the ASIC and memory modules on the same side of the motherboard may be dictated by packaging, performance or other considerations.

In this embodiment, the stacked circuit assembly 100 includes a motherboard such as printed circuit board 112. An ASIC 114 is mounted on a top or upper surface of board 112 and a heat sink 116 is mounted in close proximity to ASIC 114 at a location directly above ASIC 114. Such positioning of heat sink 116 adjacent to ASIC 114 facilitates the dissipation of heat that may be generated during operation of ASIC 114. Adjacent to ASIC 114 and mounted above the same surface as ASIC 114 is a pair of stacked printed circuit boards 113a and 113b, only portions of which are shown in FIG. 3. Boards 112, 113a, and 113b are connected to one another by means of male and female connectors 118 and 120, respectfully. Spaces 122a and 122b are defined between the surfaces of boards 112, 113a and 113b in the same manner as described earlier with reference to assembly 10.

A memory module 124 is mounted on an upper surface of board 112 and additional memory modules 124 are mounted on one or both surfaces of stacked printed circuit boards 113a and 113b. Because of the vertical arrangement of the memory modules 124 in the stacked assembly shown in FIG. 3, which is immediately adjacent to ASIC 114, the physical distance between ASIC 114 and the various memory modules 124 is kept to a minimum. As with assembly 10, assembly 100 can include numerous stacked boards such as boards 113a and 113b and they can be positioned on one or both sides of printed circuit board 112. In this embodiment, however, the location of heat sink 116 above ASIC 114 prevents the orientation of a stacked printed circuit board directly above ASIC 114 although one or more stacked boards could be spaced above heat sink 116.

Referring now to FIGS. 4 and 5, various connection patterns that can be provided in the stacked printed circuit boards are illustrated. Generally speaking, a connection pattern adapted to deliver dedicated signals is illustrated in FIG. 4, and a connection pattern adapted to deliver shared signals is illustrated in FIG. 5.

The relative position of a RAM chip or memory module 24, male connector 18, and female connector 20 on stacked printed circuit board 13a is illustrated schematically in FIG. 4. The letters "A", "B", "C", and "D" designate a sample of contacts in connectors 18 and 20. More specifically, contacts A and B are positioned within female connector 20 and contacts C and D are positioned within male connector 18. Although not shown, it will be understood that contacts C and D of male connector 18 are positioned for connection to contacts (corresponding to contacts A and B of female connector 20) of another female connector (not shown) that may be connected to another stacked board such as stacked printed circuit board 13b. Also, contacts A and B of female connector 20 can be connected to contacts (corresponding to contacts C and D of male connector 18) of a mating male connector (not shown) that may be connected to an upper surface of printed circuit board 12, for example.

For illustrative purposes, a pair of internal connections 30 and 32 are shown within the cross-section of stacked printed circuit board 13a. These internal connections 30 and 32 are considered to be dedicated connections because they provide means for communicating dedicated signals directly between a selected memory module 24 and the ASIC (not shown) to which it may be dedicated. A dedicated internal connection 30 is provided from contact A in connector 20 to the left-most lead of the RAM chip 24. The separate, dedicated internal connection 32 extends between contact B of female connector 20 and contact C of male connector 18. Such connection 32 provides a means for communicating a dedicated signal between the opposed connectors 18 and 20. In this manner, a dedicated signal can be communicated from an ASIC, through the motherboard, vertically through a motherboard interface connector and a mating female connector on a stacked printed circuit board, through the stacked printed circuit board, and upwardly through a male connector. The dedicated signal can then be delivered to a dedicated chip on the adjacent stacked printed circuit board.

In view of the nature of interface connectors such as connectors 18 and 20, which have elongated bodies with multiple contacts, and further in view of the possible use of multiple RAM chips on one or both sides of the stacked printed circuit boards, a wide variety of connection patterns can be produced in order to communicate a large number of dedicated signals.

Referring now to FIG. 5, which illustrates a connection pattern for shared signals, male and female connectors 18 and 20 are once again mounted on opposite sides of stacked printed circuit board 13a so that connections internal to the printed circuit board can be made therebetween. In this embodiment, shared internal connections 34 and 36 are provided to deliver shared signals. Specifically, internal connection 34 extends between contact A of female connector 20 and the left-most lead of the RAM chip or module 24. Also connected to contact A of female connector 20 is an internal connection 36 that extends through the thickness of stacked printed circuit board 13a to contact C of male connector 18. The signal transmitted through internal connections 34 and 36 is shared because it extends from the same contact (contact A). It can then extend farther and upwardly through contact C of male connector 18 for communication to another RAM chip on another stacked printed circuit board (not shown).

Although this invention has been described with reference to several embodiments and modifications thereof, it will be appreciated that many additional variations are contemplated and can be made without departing from the spirit or scope of this invention. The embodiment of assembly 10 illustrated in FIG. 1 shows connectors on opposite sides of the ASIC 14 so that the connectors and stacked printed circuit boards essentially straddle the portion of the motherboard to which the ASIC is attached. Although preferred, such a configuration is not required and, instead, the connectors can be positioned to one side or the other of the ASIC and the pair of connectors attached to the motherboard (as shown in FIG. 1) can be replaced by a single connector. Also, ASIC 14 and heat sink 16 are preferably mounted on an opposite side of printed circuit board 12 from the stacked printed circuit boards 13a and 13b in order to make available the space taken up by heat sink 16. Alternatively, if heat sink 16 and ASIC 14 are desirably mounted on the same side of printed circuit board 12 as the stacked printed circuit boards, then heat sink 16 can be positioned next or adjacent to the stacked printed circuit boards as shown in FIG. 3. Additional modifications can be made within the scope of the invention, which is defined in the appended claims.

What is claimed is:

1. A stackable circuit board system adapted for mounting memory modules in close proximity to an integrated circuit, said circuit board system comprising:

a circuit board, an integrated circuit mounted for electrical connection on a surface of said circuit board and a connector mounted for electrical connection on said circuit board; and at least one stackable circuit board adapted to be positioned with a surface facing said circuit board, a memory module mounted for electrical connection on a surface of said stackable circuit board, a first connector mounted for electrical connection on the facing surface of said stackable circuit board, and a second connector mounted for electrical connection on an opposite surface of said stackable circuit board, said stackable circuit board being adapted to be mounted in substantially parallel arrangement with respect to said circuit board, wherein said stackable circuit board and said circuit board together define a space therebetween;

wherein said circuit board connector mates with said first connector of said stackable circuit board, thereby providing both mechanical and electrical interconnection between said boards, and wherein said connectors together extend across the space defined between said boards;

wherein a first connector of another stackable circuit board can be mated with said second connector of said stackable circuit board; and wherein said integrated circuit and said memory module are mounted for electrical interconnection through said boards and said connectors when said connectors are mated thereby reducing the physical distance between said integrated circuit and said memory module.

2. The circuit assembly defined in claim 1, wherein said integrated circuit is mounted on a surface of said printed circuit board that faces away from said stacked printed circuit board.

3. The circuit assembly defined in claim 1, wherein said integrated circuit is mounted on a surface of said printed circuit board that faces toward said stacked printed circuit board.

4. The circuit assembly defined in claim 1, comprising at least two stacked printed circuit boards, wherein a memory module is mounted for electrical connection on a surface of each of said stacked printed circuit boards, and wherein connectors are mounted on a facing surface of each of said stacked printed circuit boards, thereby providing mechanical and electrical connection between adjacent ones of said stacked printed circuit boards.

5. The circuit assembly defined in claim 1, wherein a plurality of connectors are mounted on each facing surface of said boards.

6. The circuit assembly defined in claim 5, wherein said connectors are each positioned adjacent to an edge portion of said stacked printed circuit board.

7. The circuit assembly defined in claim 5, wherein said connectors on said printed circuit board are positioned on opposite sides of said integrated circuit.

8. The circuit assembly defined in claim 7, wherein said integrated circuit and said connectors are mounted on the same surface of said printed circuit board.

9. The circuit assembly defined in claim 4, each of said stacked printed circuit boards further comprising connection paths for communicating signals between said connectors and said memory modules.

10. The circuit assembly defined in claim 9, wherein at least one of said connection paths is oriented to share signals between said stacked printed circuit boards.

11. The circuit assembly defined in claim 9, wherein at least one of said connection paths is oriented to dedicate a signal to a memory module on one of said stacked printed circuit boards and to prevent sharing of said dedicated signal between said stacked printed circuit boards.

12. A stacked circuit assembly adapted for mounting memory modules in close proximity to an integrated circuit, said stacked circuit assembly comprising:

an integrated circuit mounted for electrical connection on a mounting surface of a circuit board;

at least two stacked circuit boards mounted in substantially parallel arrangement with respect to said circuit board on which said integrated circuit is mounted, wherein surfaces of said stacked circuit boards and a surface of said circuit board together define spaces therebetween;

a memory module mounted for electrical connection on a surface of each of said stacked circuit boards;

an interface connector mounted for electrical connection on said circuit board and an interface connector mounted for electrical connection on each of said stacked circuit boards, wherein said interface connector mounted on said circuit board mates with said interface connector on an adjacent one of said stacked circuit boards, and wherein said interface connector mounted on each of said stacked circuit boards mates with said interface connector on an adjacent one of said stacked circuit boards, thereby providing both mechanical and electrical interconnection between said boards, and wherein said interface connectors together extend across said spaces defined between said boards;

said stacked circuit boards further comprising connection paths for communicating signals between said interface connectors and said memory modules, at least one of said connection paths being oriented to share signals between said stacked circuit boards, and at least one of said connection paths being oriented to dedicate a signal to a memory module on one of said stacked circuit boards and to prevent sharing of said dedicated signal between said stacked circuit boards;

wherein said integrated circuit and said memory modules are mounted for electrical interconnection through said boards and said interface connectors, thereby reducing the physical distance between said integrated circuit and said memory modules.

13. A stacked circuit assembly adapted for mounting memory modules in close proximity to an application specific integrated circuit, said stacked circuit assembly comprising:

an integrated circuit mounted for electrical connection on a mounting surface of a printed circuit board;

at least two stacked printed circuit boards mounted in substantially parallel arrangement with respect to said printed circuit board on which said integrated circuit is mounted, said stacked printed circuit boards each having a surface facing toward a surface of an adjacent board, wherein said surfaces of said stacked printed circuit boards and a surface of said printed circuit board together define spaces therebetween, each of said stacked printed circuit boards further comprising circuit paths for communicating signals therethrough;

at least one memory module mounted for electrical connection on a surface of each of said stacked printed circuit boards, each of said memory modules being connected to at least one of said circuit paths, at least one of said circuit paths being oriented to share signals between said stacked printed circuit boards, and at least one of said circuit paths being oriented to dedicate a signal to a memory module on one of said stacked printed circuit boards and to prevent sharing of said dedicated sisal between said stacked printed circuit boards;

interface connectors mounted for electrical connection on said printed circuit board and interface connectors mounted for electrical connection on each of said stacked printed circuit boards, each of said interface connectors mounted on said stacked printed circuit boards being connected to at least one of said circuit paths, said interface connectors mounted on said printed circuit board being mated with said interface connectors mounted on a facing surface of an adjacent stacked printed circuit board and said interface connectors mounted on an opposite surface of said adjacent stacked printed circuit board being mated with said interface connectors mounted on another adjacent one of said stacked printed circuit boards, thereby providing both mechanical and electrical connection between said boards, wherein said interface connectors together extend across said spaces defined between said boards when mated;

wherein said integrated circuit and said memory modules are mounted for electrical interconnection through said boards, said interface connectors and said circuit paths, thereby reducing the physical distance between said integrated circuit and said memory module.

14. The stacked circuit assembly defined in claim 13, wherein said interface connectors mounted on each of said stacked printed circuit boards are each positioned adjacent to edge portions of said stacked printed circuit boards.

15. The stacked circuit assembly defined in claim 13, wherein said interface connectors mounted on said printed circuit board are positioned on opposite sides of said integrated circuit.

16. The stacked circuit assembly defined in claim 13, wherein said interface connectors are elongated along an axis extending substantially parallel to said boards.

17. The stacked circuit assembly defined in claim 13, wherein a plurality of memory modules are mounted for electrical connection on a surface of each of said stacked printed circuit boards.

18. A method for mounting memory modules in close proximity to an integrated circuit, said method comprising the steps of:

(a) providing a circuit board, an integrated circuit mounted for electrical connection on a surface of said circuit board, and a connector mounted for electrical connection on said circuit board;

(b) providing at least one stackable circuit board, a memory module mounted for electrical connection on a surface of said stackable circuit board, a first connector mounted for electrical connection on the facing surface of said stackable circuit board, and a second connector mounted for electrical connection on an opposite surface of said stackable circuit board;

(c) positioning said stackable circuit board with a surface facing said circuit board and in substantially parallel arrangement with respect to said circuit board, thereby defining a space between said stackable circuit board and said circuit board;

(d) mating said connector on said circuit board with said first connector on said stackable circuit board, thereby providing both mechanical and electrical interconnection between said boards, wherein said connectors together extend across the space defined between said boards;

(e) positioning said second connector of said stacked circuit board for mating with a first connector of another stacked circuit board; and (f) providing electrical interconnection through said boards and said connectors, thereby reducing the physical distance between said integrated circuit and said memory module.

* * * * *